(12) United States Patent
Mokerji

(10) Patent No.: US 6,277,494 B1
(45) Date of Patent: Aug. 21, 2001

(54) CHROME COATED ARTICLE

(75) Inventor: Subrata Mokerji, Shelby Township, MI (US)

(73) Assignee: MascoTech, Inc., Taylor, MI (US)

( * ) Notice: Subject to any disclaimer, the term of this patent is extended or adjusted under 35 U.S.C. 154(b) by 0 days.

(21) Appl. No.: 09/263,901

(22) Filed: Mar. 5, 1999

(51) Int. Cl.[7] .................................................. B32B 15/04
(52) U.S. Cl. ........................ 428/457; 428/458; 428/467; 428/463; 428/522; 428/516
(58) Field of Search ................................. 428/457, 461, 428/463, 458, 522, 516

(56) References Cited

U.S. PATENT DOCUMENTS

| | | | |
|---|---|---|---|
| Re. 34,173 | 2/1993 | Kerber | 428/610 |
| 3,838,512 | 10/1974 | Sanderson | 30/346.54 |
| 3,977,839 | 8/1976 | Palisin, Jr. | 428/626 |
| 4,109,052 | 8/1978 | Anderson | 428/409 |
| 4,226,082 | 10/1980 | Nishida | 368/285 |
| 4,256,346 | 3/1981 | Kawaguchi et al. | 301/64.2 |
| 4,305,981 | 12/1981 | Muroi et al. | 428/31 |
| 4,321,299 | 3/1982 | Frazer | 442/379 |
| 4,369,225 | 1/1983 | Manabe et al. | 428/334 |
| 4,374,717 | 2/1983 | Drauglis et al. | 204/192.14 |
| 4,591,418 | 5/1986 | Snyder | 204/192.16 |
| 4,699,850 | 10/1987 | Kishi et al. | 428/469 |
| 4,877,657 | 10/1989 | Yaver | 428/31 |
| 4,911,811 | 3/1990 | Mullaney, Jr. | 204/192.14 |
| 4,931,366 | 6/1990 | Mullaney, Jr. | 428/622 |
| 5,268,215 | * 12/1993 | Krenceski | 428/213 |
| 5,319,032 | * 6/1994 | Martz | 525/301 |
| 5,413,874 | 5/1995 | Moysan, III et al. | 428/627 |
| 5,476,724 | 12/1995 | Moysan, III et al. | 428/627 |
| 5,478,659 | 12/1995 | Moysan, III et al. | 428/627 |
| 5,478,660 | 12/1995 | Moysan, III et al. | 428/627 |
| 5,482,788 | 1/1996 | Moysan, III et al. | 428/627 |
| 5,484,663 | 1/1996 | Moysan, III et al. | 428/627 |
| 5,510,164 | 4/1996 | Best et al. | 428/641 |
| 5,552,233 | 9/1996 | Moysan, III et al. | 428/627 |
| 5,589,280 | 12/1996 | Gibbons et al. | 428/626 |
| 5,626,972 | 5/1997 | Moysan, III et al. | 428/627 |
| 5,639,564 | 6/1997 | Moysan, III et al. | 428/627 |
| 5,641,579 | 6/1997 | Moysan, III et al. | 428/627 |
| 5,648,179 | 7/1997 | Moysan, III et al. | 428/627 |
| 5,654,108 | 8/1997 | Moysan, III et al. | 428/627 |
| 5,667,904 | 9/1997 | Moysan, III et al. | 428/627 |
| 5,693,427 | 12/1997 | Moysan, III et al. | 428/627 |
| 5,716,721 | 2/1998 | Moysan, III et al. | 428/627 |
| 5,783,313 | 7/1998 | Moysan, III et al. | 428/627 |
| 5,814,415 | 9/1998 | Moysan, III et al. | 428/627 |
| 5,863,646 | * 1/1999 | Verardi | 428/323 |
| 5,879,532 | 3/1999 | Foster et al. | 205/192 |

* cited by examiner

Primary Examiner—Leszek Kiliman
(74) Attorney, Agent, or Firm—Myron B. Kapustij; Lloyd D. Doigan

(57) ABSTRACT

A thermoplastic polyolefin article is coated with a multilayer coating comprising a halogenated polyolefin primer layer, polymeric base coat layer deposited on the primer layer, a chrome or chrome and nickel alloy layer deposited on the polymeric layer, and a polymeric top coat layer deposited on the chrome or chrome and nickel alloy layer.

11 Claims, 1 Drawing Sheet

CHROME COATED ARTICLE

FIELD OF THE INVENTION

The instant invention relates to a thermoplastic polyolefin substrate having a leveling polymeric base coat thereon, and a decorative chrome layer on the polymeric base coat.

SUMMARY OF THE INVENTION

In accordance with this invention a polymeric base coat is provided on the surface of a substrate comprised of a thermoplastic polyolefin. An adhesion promoting halogenated polyolefin primer layer is disposed on the polyolefin substrate to improve the adhesion of the polymeric base coat. The polymeric base coat provides a leveling effect to the surface of the substrate. A decorative chrome layer is then applied onto the base coat. In one embodiment a protective polymeric top coat is provided over the chrome layer.

BACKGROUND OF THE INVENTION

Thin chrome layers have been applied by electroplating or vapor deposition onto the surfaces of various substrates to provide a decorative and shiny appearance thereto. However, the substrates have had to be pretreated by polishing, cleaning and the like to remove any scratches or other imperfections from their surfaces before the chrome layer is applied thereon. Otherwise, the chrome layer will enhance and accentuate these imperfections. Various polymeric base coats can be used to cover any imperfections on the substrate. However, when the substrate is a thermoplastic polyolefin there is a problem with adhesion of the polymeric base coat to the substrate.

The present invention provides a thermoplastic polyolefin substrate having a halogenated polyolefin primer layer and decorative chrome layer which is not subject to the aforementioned disadvantages.

DESCRIPTION OF THE PREFERRED EMBODIMENT

Figure 1:
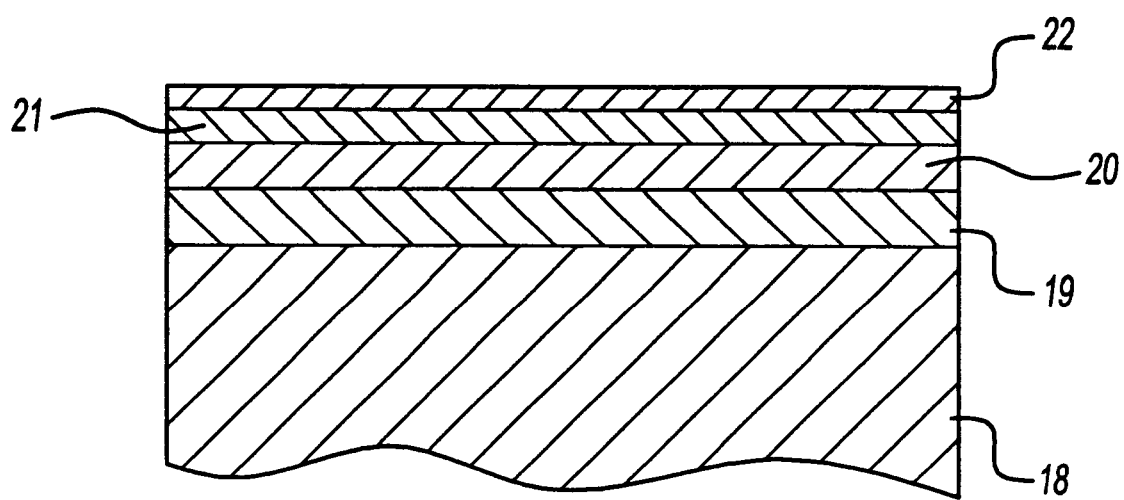
FIG. 1 is a cross-sectional view, not to scale of a portion of the substrate having the multi-layer coating on its surface.

The article or substrate 18 is comprised of a thermoplastic polyolefin. Thermoplastic polyolefins are conventional and well known polymers that are generally commercially available. The thermoplastic polyolefins are obtained or derived from acyclic olefins and/or selected cyclic olefins. Typical examples of polyolefins include, but are not limited to, polyethylene, polypropylene, ethylene-propylene copolymer, ethylene-propylenediene terpolymer, ethylene-propylene-hexadiene terpolymer, ethylene-propylene-dicyclopentadiene terpolymer and ethylene-propylene-ethylidenenorbornene terpolymer. The thermoplastic polyolefins, along with methods for their preparation, are described, inter alia, in U.S. Pat. Nos. 5,866,663; 5,861,463 and 4,186,240, all of which are incorporated herein by reference. In one embodiment the article is part of a vehicle, such as for example, a wheel cover.

Over the surface of the substrate 18 is deposited a primer layer 19 comprised of halogenated polyolefin. This is due to the fact that the polymeric base coat 20 does not adhere sufficiently durably to the thermoplastic polyolefin substrate. The primer layer 19 improves the adhesion and durability of adhesion of the base coat to the thermoplastic polyolefin substrate 18. The halogenated polyolefins are conventional and well known polymers that are generally commercially available. The preferred halogenated polyolefins are the chlorinated and brominated polyolefins, with the chlorinated polyolefins being more preferred. The halogenated, particularly chlorinated, polyolefins along with methods for their preparation are disclosed, inter alia, in U.S. Pat. Nos. 5,319,032; 5,840,783; 5,385,979; 5,198,485; 5,863,646; 5,489,650 and 4,273,894, all of which are incorporated herein by reference.

The thickness of the primer layer 19 is a thickness effective to improve the adhesion of the polymeric base coat layer 20 to the substrate 18. Generally this thickness is at least about 0.01 mil. The upper thickness is not critical and generally is controlled by secondary considerations such as cost and appearance. Generally an upper thickness of about 2 mil should not be exceeded.

Over the primer layer 19 is deposited a polymeric base coat 20. The polymeric base coat 20 may be comprised of both thermoplastic and thermoset polymeric material. These polymeric materials include the well known, conventional and commercially available polyacrylates, polymethacrylates, polyepoxies, alkyds and styrene containing polymers such as polystyrene, styreneacrylonitrile (SAN), and blends and copolymers thereof.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate and polymethacrylate resins useful in the practice of the invention may be accomplished by any of the well known polymerization techniques.

The styrene-acrylonitrile resins and their preparation are disclosed, inter alia, in U.S. Pat. Nos. 2,769,804; 2,989,517; 2,739,142; 3,935,152; 4,291,134 and 4,243,781, all of which are incorporated herein by reference.

The alkyd resins are disclosed in "Alkyd Resin Technology", Patton, Interscience Publishers, N.Y., N.Y., 1962, and in U.S. Pat. Nos. 3,102,866; 3,228,787 and 4,511,692, all of which are incorporated herein by reference.

These polymeric materials may optionally contain the conventional and well known fillers such as mica, talc and glass fibers.

The polymeric layer or base coat 20 is applied onto the primer layer 19 by any of the well known and conventional methods such as dipping, spraying and brushing.

The polymeric layer 20 functions, inter alia, to level the surface of the substrate, cover any scratches or imperfections in the surface and provide a smooth and even surface for the deposition of the chrome layer.

The polymeric layer 20 has a dry or cured thickness at least effective to level out the surface of the substrate. Generally, this thickness is from about 0.1 mils to about 10 mils, preferably from about 0.2 mils to about 5 mils, and more preferably from about 0.3 mils to about 1.5 mils.

The chrome layer 21 may be deposited on the polymeric layer 20 by any of the conventional and well known chrome deposition techniques including vapor deposition such as physical vapor deposition and chemical vapor deposition techniques.

The vapor deposition of the chrome is conventional and well known in the art and includes techniques such as cathodic arc evaporation (CAE) or sputtering. Sputtering techniques and equipment are disclosed, inter alia, in J. Vossen and W. Kern "Thin film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a metal (i.e., chrome) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as chrome. The arc vaporizes the cathode material, which then condenses on the substrates forming a coating.

Chemical vapor deposition (CVD) is defined as the formation of a non-volatile solid film on a substrate by the reaction of vapor phase reactants that contain desired components. The gases are introduced into a reactor vessel, and decompose and react at a heated surface on the substrate to form the desired film.

CVD is generally classified into one of three types. The first two are principally predicated upon reactor pressure, and are designated as atmospheric pressure chemical vapor deposition (APCVD) or low pressure chemical vapor deposition (LPCVD).

A third category is referred to as plasma enhanced chemical vapor deposition (PECVD). Rather than relying solely on thermal energy to initiate and sustain chemical reactions, PECVD uses a radio frequency (RF) induced glow discharge or direct current or microwaves to transfer energy into the reactant gases, allowing the substrate to remain at lower temperature than in APCVD or LPCVD processes. Specifically, the plasma-inducing glow discharge is generated by the application of an RF field to a low pressure gas, thereby creating free electrons within the discharge region. The electrons gain sufficient energy from the electric field so that when they collide with gas molecules, gas-phase dissociation and ionization of the reactant gases (i.e., inducement into the plasma state) then occurs. Lower substrate temperature is the major advantage of PECVD, and provides a method of depositing films on some substrates which do not have a thermal stability to accept coating by other methods. In addition, PECVD can enhance the deposition rate when compared to thermal reactions alone, and produces films of unique compositions and properties.

In another embodiment layer 21 is comprised of chrome and nickel alloy. The chrome/nickel alloy which comprises layer 21 generally contains, in percent by weight, from about 5% to about 95% nickel and from about 95% to about 5% chrome, preferably from about 50% to about 90% nickel and from about 10% to about 50% chrome, and more preferably from about 70% to about 90% nickel and from about 10% to about 30% chrome.

The chrome/nickel alloy layer 21 is generally deposited in the same manner as the chrome layer, except that in the case of vapor deposition the target is comprised of chrome/nickel alloy instead of chrome.

The thickness of the chrome or chrome/nickel alloy layer 21 is at least a thickness effective to provide a decorative appearance to the article. Generally this thickness is from about 200 Angstroms to about 35 microns, preferably from about 400 Angstroms to about 5,000 Angstroms.

In one embodiment of the instant invention the chrome or chrome and nickel alloy layer 21 is the top layer. In another embodiment of the invention a protective top coat layer 22 is applied over chrome or chrome and nickel alloy layer 21. The top coat 22 which is applied over layer 21 should ideally be weather resistant, impact resistant, abrasion resistant, flexible, non-yellowing and transparent. The term "transparent" is defined as a coating through which the chrome layer can be seen. It is preferred that the transparent coating be substantially colorless so that the esthetic effects of the chrome or chrome and nickel alloy layer 21 are not substantially decreased. However, in some instances the addition of color to the transparent layer can be esthetically beneficial. Polymeric or resinous coating material which exhibit good mixture of all of these properties are polyurethanes, polyacrylates, polymethacrylates and silicones. Of these polyurethanes are preferred as they exhibit a particularly good blend of all of these properties.

Polyurethanes are well known in the art and are readily commercially available. Various known polyols and polyisocyanates are used to form polyurethanes. Polyurethanes are useful as coatings and are described, for example, in Chapter X, Coatings, pp. 453–607 in J. H. Saunders and K. C. Frisch, Polyurethanes: Chemistry and Technology, Part II, Interscience Publishers (N.Y., 1964), incorporated herein by reference.

Suitable polyurethanes may be prepared in a conventional manner such as by reacting polyols or hydroxylated polymers with organic polyisocyanates in the manner well known in the art. Suitable organic polyisocyanates include, for instance, ethylene diisocyanate; ethylidene diisocyanate; propylene-1,2-diisocyanate; cyclohexylene-1,2-diisocyanate; m-phenylene diisocyanate; 2,4-toluene diisocyanate; 2,6-toluene diisocyanate; 3,3'-dimethyl-4,4'-biphenylene diisocyanate; p,p',p"-triphenylmethane triisoene diisocyanate; 3,3'-diphenyl-4,4'-biphenylene diisocyanate; 4,4'-biphenylene diisocyanate; 3,3'-dichloro-4,4-biphenylene diisocyanate; p,p',p"-triphenylmethane triisocyanate; 1,5-mepthalene diisocyanate; furfurylidene diisocyanate or polyisocyanates, in a blocked or inactive form such as the bis-phenyl carbamates of 2,4- or 2,6-toluene diisocyanate; p,p=-diphenyl methane diisocyanate; p-phenylene diisocyanate; 1,5-napthalene diisocyanate and the like. It is preferred to use a commercially available mixture of toluene diisocyanates which contains 80 percent 2,4-toluene diisocyanate and 20 percent 2,6-toluene diisocyanate or 4,4-diphenylmethane diisocyanate.

Polyurethanes applied as coatings in accordance with the invention may, of course, be in the form of solutions in suitable solvents such as xylene, toluene, methyl ethyl ketone, butanol, butyl acetate, etc.

Materials for the polyurethane coatings may be supplied in one package or two package prepolymer systems or oil modified systems, etc., all in the manner well known in the industry. Such materials are described for instance in the pamphlet "Urethane Coatings", published by the Federation of Societies for Paint Technology (1970). Radiation-curable urethane coatings may also of course be used.

Some illustrative examples of suitable polyurethane compositions are disclosed in U.S. Pat. Nos. 4,699,814; 4,681,811; 4,703,101; 4,403,003 and 5,268,215, all of which are incorporated herein by reference.

Another suitable type of polyurethane is an acrylic polyurethane. The acrylic polyurethanes are described in U.S. Pat. Nos. 3,558,564; 4,131,571 and 4,555,535, all of which are incorporated herein by reference.

Polyacrylates and polymethacrylates which may be used in layer 22 are described supra.

The silicones or organopolysiloxanes which are utilized in the instant invention are conventional, well known and generally commercially available. They are disclosed, inter alia, in U.S. Pat. Nos. 3,375,223; 3,435,001; 3,450,672; 3,790,527; 3,832,319; 3,865,766; 3,888,815; 3,887,514; 3,925,276; 3,986,997 and 4,027,073, the disclosures of which are incorporated herein by reference.

The organopolysiloxanes are applied from a top coat composition containing a further curable organopolysiloxane and, generally, solvents for the further curable organopolysiloxane. The top coat composition may be applied by standard and conventional techniques such as spraying, brushing, etc. over the chrome layer.

To cure the further curable organopolysiloxane and form the silicone resin top coat the top coat composition is then heated at a temperature and for a time effective to cure said further curable organopolysiloxane.

One particular class of further curable organopolysiloxanes which are employed in the top coat compositions of the present invention are the partial hydrolysis and condensation products of alkoxy functional silanes, preferably alkyltrialkoxysilanes, preferably those alkyltrialkoxysilanes wherein the alkyl group contains from 1 to about 8 carbon atoms, and aryltrialkoxysilanes, preferably phenyltriakoxysilanes, or mixtures thereof, wherein the alkoxy group contains from 1 to about 8 carbon atoms, such as, for example, methoxy, ethoxy, isopropoxy, butoxy, pentoxy, hexoxy, octoxy, and the like. These further curable organopolysiloxanes are generally prepared by a process wherein the alkyltrialkoxysilane and aryltrialkoxysilane is heated in the presence of water, wherein the molar ratio of water to total silane is at least about 1.5:1 and in the presence of an effective amount of a hydrolysis catalyst, such as a mineral acid, for example, HCl, for about 1 to about 10 hours at a temperature between ambient and reflux to produce a siloxane partial condensation product; the partial condensation product is then concentrated by heating to remove 50 to about 90 mole percent alkanol by-product and some water, and thereafter, the concentrated partial condensation product is pre-cured by heating at a temperature below the gel point thereof and generally in the range of about 70° to 300° C. to produce the solvent-soluble, further curable organopolysiloxane. This precured solvent-soluble, further curable organopolysiloxane is then dissolved in a suitable solvent to form the top coat composition and the chrome layer 21 is then coated with this top coat composition. The solvent is then evaporated and the residual further curable organopolysiloxane is cured to a thermoset state to provide a top coat. The curing is effected at elevated temperatures in the range of about 50° to 135° C. for times between about 1 hour to about 72 hours, depending on the temperature at which the cure is effected. The silicone top coat generally should be cured preferably at an elevated temperature to effect the proper cure.

One particular further curable organopolysiloxane that can be employed in the top coat composition of the instant invention is the partial hydrolysis and condensation product of methyltriethoxysilane. This further curable organopolysiloxane is prepared by hydrolyzing methyltriethoxysilane with water in the presence of an effective amount of a hydrolysis catalyst, such as HCl, for about 1 to 10 hours at a temperature generally between 40° C. and reflux temperature, to produce a partial condensation product. This partial condensation product is then concentrated by heating to remove some of the alkanol by-product and water. This concentrated product is then partially pre-cured at a temperature of about 70° to about 300° C. and below the gel point thereof and then solidified to provide a solid, solvent-soluble, further curable organopolysiloxane is then dissolved to a desired concentration in a suitable solvent to form the top coat composition. The top coat composition is then applied to the primed polycarbonate substrate, after which the solvent is evaporated and the further curable organopolysiloxane finally cured to provide a hard, abrasion and chemical solvent resistant, thermoset organopolysiloxane top coat on the polycarbonate substrate.

Another further curable organopolysiloxane which may be employed in the practice of the present invention is the partial hydrolysis and condensation product of a mixture of methyltriethoxysilane and phenyltriethoxysilane. This organopolysiloxane is prepared by hydrolyzing a mixture of methyltriethoxysilane and phenyltriethoxysilane with water in the presence of a hydrolysis catalyst such as HCl to produce a partial condensation product. This partial condensation product is then concentrated by heating to remove a substantial amount of the alkanol by-product and some water. This concentrated product is then partially pre-cured by heating and then solidified to provide a solid, solvent-soluble, further curable organopolysiloxane. The solid, solvent-soluble, further curable organopolysiloxane is then dissolved to a desired concentration in a suitable solvent to form the top coat composition containing a further curable organopolysiloxane. The top coat composition is then applied to the primed polycarbonate substrate, after which the solvent is evaporated and the further curable organopolysiloxane is finally cured to provide a tenaciously and durably adhered, abrasion and chemical resistant thermoset organopolysiloxane top coat on the polycarbonate substrate.

These are not the only silicones that may be utilized in the top coats of the instant invention. Also useful are silicone resins composed of trifunctional and difunctional units, silicone resins composed of trifunctional units, difunctional units and tetrafunctional units where the organo substituent groups in the trifunctional units may be selected from hydrocarbon radicals of 1 to about 8 carbon atoms and are preferably methyl, phenyl and vinyl; a nd wherein the organo substituent groups in the difunctional siloxy units may be selected from hydrocarbon units of from 1 to about 8 carbon atoms, preferably alkyl radicals, vinyl radicals and phenyl radicals. Such silicone resins usually have an organic to silicone atom ratio of 1:1 to 1.9:1, may have a silanol content that varies anywhere from 4 to 10 weight percent and optionally may have an alkoxy content that varies from 2 to 4%. The preparation of such silicone resins which may be utilized as top coats in the invention of the instant case are, for instance, to be found in U.S. Pat. Nos. 3,375,223; 3,435,001; 3,450,672; 3,790,527; 3,832,319; 3,865,766; 3,887,514 and 3,925,276.

These silicones may also contain fillers such as, for example, glass, talc and silica, preferably colloidal silica.

The coating compositions containing the afore-described silicones are simply brushed, dipped, sprayed or flowed on top of the chrome coated substrate. The solvent, or alcohol by-product and water, present in the top coat composition is evaporated and the residual further curable organopolysiloxane is cured to form a thermoset organopolysiloxane top coat. Preferably, the further curable organopolysiloxane is cured at elevated temperatures. Although certain catalysts may be utilized to accelerate the cure of the further curable organopolysiloxane, such catalysts are not necessary if the further curable organopolysiloxane is cured by itself at the elevated temperature for a sufficient length of time.

The dry or cured thickness of layer 22 is a thickness at least effective to protect the underlying chrome layer. Generally this thickness is from about 0.05 mil to about 10 mils, preferably from about 0.1 mil to about 3 mils and more preferably from about 0.3 mil to about 1.5 mils.

In order that the invention may be more readily understood the following example is provided. The example is illustrative and does not limit the invention thereto.

EXAMPLE 1

A thermoplastic polypropylene substrate is ultrasonically cleaned and then dried at 200° F. for 15 minutes to remove moisture. A chlorinated polyethylene primer is then applied on the substrate. The primer has 2 to 20% solids and is dispersed in a 50/50 mixture of toluene and xylene. After the application of the primer, a 3 to 5% ambient air flash is allowed on the substrate. A polymeric base coat is then applied on the primed substrate by using a high volume low pressure paint gun. The polymer is comprised 35 weight percent styrenated acrylic resin, 30 weight percent melamine formaldehyde resin and 35% bisphenol epoxy resin. The polymer is dissolved in butyl acetate solvent to allow a polymeric composition of 43 weight percent solids. After the base coat application, the substrate is allowed to stand for a 20 minute ambient air flash off. The substrate is then baked at 275° F. for 2.5 hours. The resulting cured polymeric base coat has a thickness of 0.8 to 1.0 mil.

The base coated substrate is a placed on metallizing rack. The metallizing rack is placed into a vacuum chamber which is evacuated down to a vacuum level of 5×10E−5 torr. About 50 standard cubic centimeters per minute of argon is introduced into the chamber. An electric arc is struck at the end of a chrome target. As the arc travels from the back end of the target to the front, its polarity is reversed, thereby causing the arc to move back and forth to evaporate the chrome and deposit it on the coated substrate. A current of 500 amps is applied to the target. After 30 minutes the argon flow rate is increased to 75 standard cubic centimeters per minute and deposition of chrome is continued for another 30 minutes. The substrate is then allowed to cool inside the chamber and the chamber is vented. The chrome layer has a thickness of 4,800 Angstroms.

The substrate has the appearance of glossy chrome and is resistant to abrasion and corrosion.

While certain embodiments of the invention have been described for purposes of illustration, it is to be understood that there may be other additional various embodiments and modifications within the general scope of the invention.

I claim:

1. An article comprised of thermoplastic polyolefin having on at least a portion of its surface a multilayer coating comprising:

a halogenated polyolefin primer layer on at least a portion of the surface;

a base coat layer comprised of polymeric material; and a layer consisting essentially of vapor deposited chrome and nickel alloy or vapor deposited chrome.

2. The article of claim 1 wherein said halogenated polyolefin is chlorinated polyolefin.

3. The article of claim 1 wherein said layer consisting essentially of vapor deposited chrome and nickel alloy or of vapor deposited chrome consists essentially of vapor deposited chrome and nickel alloy.

4. The article of claim 1 wherein said layer consisting essentially of vapor deposited chrome and nickel alloy or of vapor deposited chrome consists essentially of vapor deposited chrome.

5. An article comprised of thermoplastic polyolefin having on at least a portion of its surface a multilayer coating comprising:

a halogenated polyolefin primer layer on at least a portion of the surface;

a base coat layer comprised of polymeric material;

a layer consisting essentially of vapor deposited chrome and nickel alloy or of vapor deposited chrome;

and a top layer comprised of a polymeric material.

6. The article of claim 5 wherein said halogenated polyolefin is chlorinated polyolefin.

7. The article of claim 5 wherein said polymeric material comprising said top layer is comprised of polyurethane, polyacrylate, polymethacrylate and silicone.

8. The article of claim 5 wherein said layer consisting essentially of vapor deposited chrome and nickel alloy or chrome consists essentially of vapor deposited chrome and nickel alloy.

9. The article of claim 5 wherein said layer consisting essentially of vapor deposited chrome and nickel alloy or chrome consists essentially of vapor deposited chrome.

10. The article of claim 5 wherein the vapor deposited chrome and nickel alloy or chrome is physical vapor deposited chrome and nickel alloy or chrome.

11. The article of claim 1 wherein the vapor deposited chrome and nickel alloy or chrome is physical vapor deposited chrome and nickel alloy or chrome.

* * * * *